United States Patent
Raina et al.

(10) Patent No.: US 12,228,994 B2
(45) Date of Patent: Feb. 18, 2025

(54) METHOD, APPARATUS, AND SYSTEM FOR CALIBRATING A PROCESSOR POWER LEVEL ESTIMATE

(71) Applicant: Ampere Computing LLC, Santa Clara, CA (US)

(72) Inventors: Sarthak Raina, Apex, NC (US); Sanjay Patel, Cary, NC (US); Hoan Tran, San Jose, CA (US); Mitrajit Chatterjee, Los Altos, CA (US); Abhishek Niraj, Cupertino, CA (US); Anuradha Raghunathan, San Jose, CA (US)

(73) Assignee: Ampere Computing LLC, Santa Clara, CA (US)

( * ) Notice: Subject to any disclaimer, the term of this patent is extended or adjusted under 35 U.S.C. 154(b) by 0 days.

(21) Appl. No.: 17/472,319

(22) Filed: Sep. 10, 2021

(65) Prior Publication Data
US 2023/0079292 A1   Mar. 16, 2023

(51) Int. Cl.
G06F 1/324 (2019.01)
G01R 21/133 (2006.01)
G06F 1/3206 (2019.01)
G06F 1/3296 (2019.01)

(52) U.S. Cl.
CPC .......... G06F 1/324 (2013.01); G01R 21/133 (2013.01); G06F 1/3296 (2013.01)

(58) Field of Classification Search
CPC ...... G06F 1/324; G06F 1/3296; G01R 21/133
See application file for complete search history.

(56) References Cited

U.S. PATENT DOCUMENTS

| | | | | |
|---|---|---|---|---|
| 8,281,160 | B1* | 10/2012 | Bai | G06F 1/324 713/300 |
| 2013/0024713 | A1* | 1/2013 | Bajic | G06F 1/324 713/340 |
| 2013/0031385 | A1* | 1/2013 | Seto | G06F 1/28 713/300 |
| 2014/0195828 | A1* | 7/2014 | Varma | G06F 1/3296 713/300 |
| 2016/0037686 | A1* | 2/2016 | Shabbir | G06F 1/206 700/300 |

(Continued)

*Primary Examiner* — Phil K Nguyen
*Assistant Examiner* — Gayathri Sampath
(74) *Attorney, Agent, or Firm* — Muncy, Geissler, Olds & Lowe, P.C.

(57) ABSTRACT

A system and method are described herein for estimating power usage of various components of a CPU and controlling voltage regulators based on the estimated power usage. The power estimates may be based on digital power meter readings at each component, on voltage information from a voltage regulator, and on other power information. This power information is transmitted over a mesh interconnect disposed throughout the CPU such that power estimation can be accurately calculated and used to control voltage regulators without being limited by external bus speeds. More of the power management processes and components may be disposed on the CPU and connected to the mesh interconnect. These power management processes include various calibrations, adjustments, and limits so as efficiently manage and use the more rapidly processed power estimations.

24 Claims, 7 Drawing Sheets

(56) References Cited

U.S. PATENT DOCUMENTS

| | | | | |
|---|---|---|---|---|
| 2016/0204614 A1* | 7/2016 | Itaya | ................. | H02J 13/00034 |
| | | | | 307/82 |
| 2017/0052554 A1* | 2/2017 | Fukaura | ................... | G05F 1/66 |
| 2018/0082224 A1* | 3/2018 | Leslie | ....................... | G06F 9/50 |
| 2020/0050920 A1* | 2/2020 | Idgunji | ................... | G06F 1/324 |
| 2020/0243119 A1* | 7/2020 | Spica | ................. | G06F 11/0727 |

\* cited by examiner

METHOD, APPARATUS, AND SYSTEM FOR CALIBRATING A PROCESSOR POWER LEVEL ESTIMATE

BACKGROUND

I. Field of the Disclosure

The technology of this disclosure relates generally to the control of power usage and delivery on a system-on-chip (SoC), and specifically to the collection and integration of distributed data sources into a power level estimation.

II. Background

In order to respond to various conditions and events that may occur across a system-on-chip (SoC), such as a multi-core processor, the SoC may include different types of sensors, flags, and warning signals. These sensor signals are sent from different components over different protocols, buses, and multiplexers to various management components. These sensors may collect and report information related to the operation of the SoC. Examples of types of sensors that may be used include temperature sensors (which measure the temperature at a particular physical location on the SoC), fault indicators, switches, and power event monitors (which observe and report on power events at a particular physical location on the SoC).

Typically, the usability of the information from these various sources is limited due to the rapidly changing conditions on a SoC and interconnectedness of many of the parameters being measured by distinct sensors (e.g., voltage/resistance and temperature). For example, such sensing and processing may have full cycle times between detection and control in the millisecond range whereas conditions on the processor are changing at the hundreds of microseconds range. Thus, heat damage, over voltage, and under power events may occur before sensor information can be utilized. In large part, the slowness of these control processes is due to the communication buses used for sensor signals and the separation of the controllers from the hardware being controlled.

As a result of the inefficiency and delay inherent in past control systems, further expansion of the sensor network provided little practical benefit regarding controlling such events in the system. Accordingly, sensors were instead treated as monitors for higher level software systems such as the basic input output system (BIOS), operating system (OS), or hypervisor. Thus, faster, lower-level information sharing and usage is needed for processors, and, specifically, for processor power control.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

In an example implementation, a system-on-a-chip (SoC) is provided with a processor power management component that receives a first power information from a digital power meter (DPM) associated with a first component of a system-on-a-chip and receives a second power information from a voltage regulator (VR) associated with the first component of the system-on-a-chip. The processor power management component may then generate a power estimate value based on the first power information and the second power information and may generate comparison information by comparing the first power information to the second power information. A power to the first component or the system-on-a-chip may then be controlled based on the power estimate value or the comparison information.

In an example implementation, the processor power management component may determine a correction value based on the comparison information and generate a corrected first power information by applying the correction value to the first power information. The processor power management component may generate a corrected power estimate value based on the corrected first power information and the second power information and then output the corrected power estimate value to a dynamic voltage and frequency scaling (DVFS) component to manage the power to the first component and/or a system power to the system-on-a-chip. The DPM may measure a first power usage of the first component, where the first power information includes the first power usage. In an implementation, the first component may be a memory controller, a peripheral component interconnect express (PCIe) root complex, a processor core, a system management controller, or a common interface management controller. Indeed one or more of these structures may be provided with the various sensors and form a part of the power control management system.

In an example implementation, a power management circuit may include a first information input, a second information input, and a power estimation component. The first input may receive first power information from a digital power meter (DPM) connected to a first component of a system-on-a-chip and the second input may receive second power information from a voltage regulator (VR) connected to the first component of the system-on-a-chip. The power estimation component may then determine a power estimate value based on the first power information and the second power information and generate comparison information from a comparison between the first power information and the second power information. The power of the first component or the system-on-a-chip can then be controlled based on the power estimate value and the comparison information. In other words, the power estimation component uses information from a digital power meter and a voltage regulator associated with a hardware component and quickly determines a power estimate and relays control information.

In an example implementation, the power management circuit and/or the power estimation component may further determine a correction value based on the comparison information, generates a corrected first power information by applying the correction value to the first power information, and generates a corrected power estimate value based on the corrected first power information and the second power information, wherein the power estimation transmits the corrected power estimate value to a dynamic voltage and frequency scaling (DVFS) component that manages the power to the first component or the system-on-a-chip. The power management circuit may include a proportional-integral-derivative (PID) controller that receives the corrected power estimate and generates a control value at the PID controller, where the DVFS component calibrates a processor complex (PCP) power based on the control value and/or the corrected power estimate. The processor complex (PCP) domain may be a special or functional subset of the powered circuit architecture of the system-on-a-chip (SoC).

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

DETAILED DESCRIPTION OF THE DRAWINGS

Figure 1:
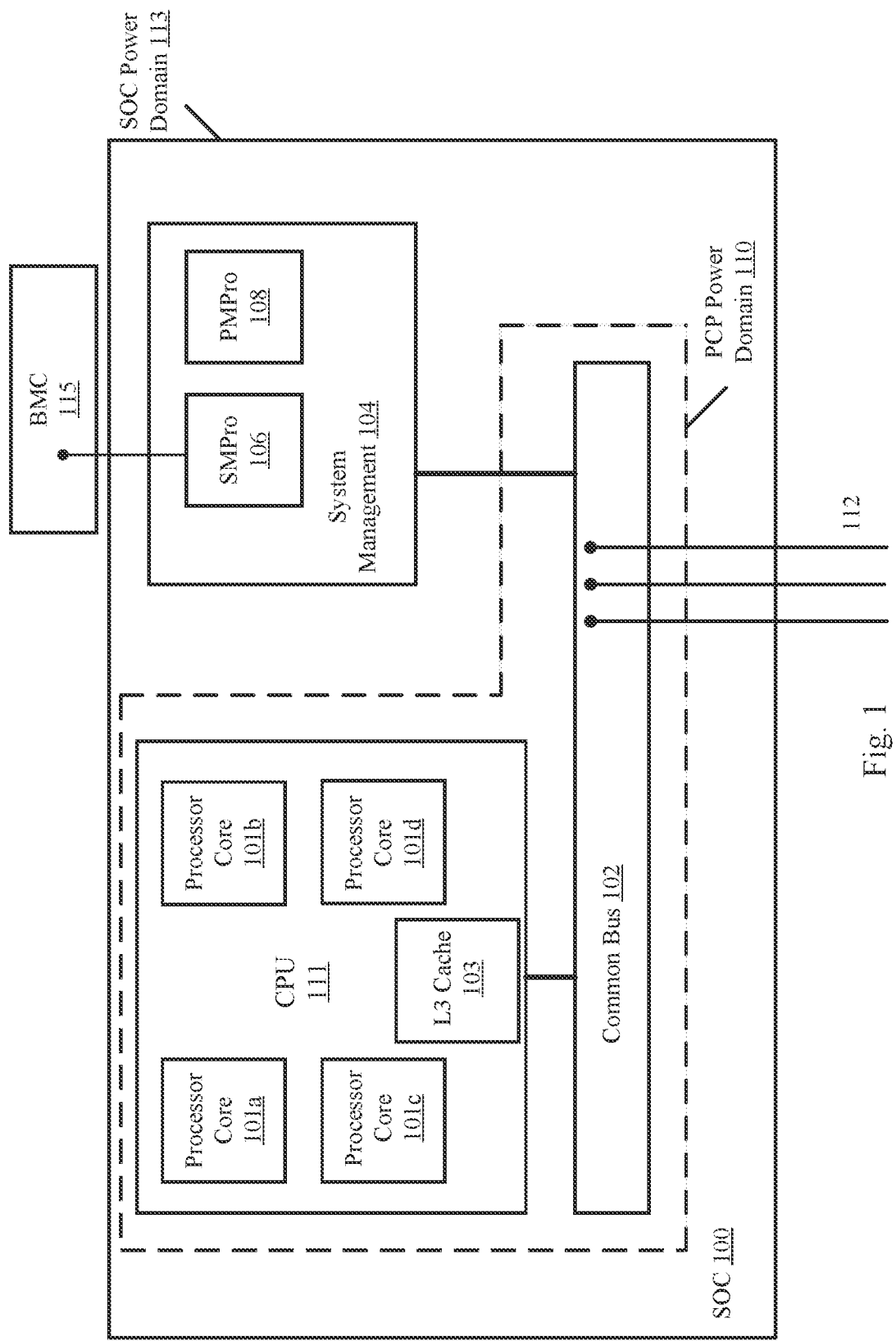
FIG. 1 is a schematic block diagram of a system-on-a-chip according to an example implementation.

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

The word "exemplary" is used herein to mean "serving as an example, instance, or illustration." Any implementation described herein as "exemplary" is not necessarily to be construed as preferred or advantageous over other embodiments. Likewise, the term "implementation" does not require that all implementations include the discussed feature, advantage, or mode of operation.

The terminology used herein describes particular implementations only and should not be construed to limit any implementations disclosed herein. As used herein, the singular forms "a," "an," and "the" are intended to include the plural forms as well, unless the context clearly indicates otherwise. Those skilled in the art will further understand that the terms "comprises," "comprising," "includes," and/or "including," as used herein, specify the presence of stated features, integers, steps, operations, elements, and/or components, but do not preclude the presence or addition of one or more other features, integers, steps, operations, elements, components, and/or groups thereof.

Various components as described herein may be implemented as application specific integrated circuits (ASICs), programmable gate arrays (e.g., FPGAs), firmware, hardware, software, or a combination thereof. Further, various aspects and/or embodiments may be described in terms of sequences of actions to be performed by, for example, elements of a computing device. Those skilled in the art will recognize that various actions described herein can be performed by specific circuits (e.g., an application specific integrated circuit (ASIC)), by program instructions being executed by one or more processors, or by a combination of both. Additionally, these sequences of actions described herein can be considered to be embodied entirely within any form of non-transitory computer-readable medium having stored thereon a corresponding set of computer instructions that upon execution would cause an associated processor to perform the functionality described herein. Thus, the various aspects described herein may be embodied in a number of different forms, all of which have been contemplated to be within the scope of the claimed subject matter. In addition, for each of the aspects described herein, the corresponding form of any such aspects may be described herein as, for example, "logic configured to", "instructions that when executed perform", "computer instructions to" and/or other structural components configured to perform the described action.

A system-on-a-chip (SoC) may include one or more processing cores in a CPU, one or more cache memories (e.g., L1, L2, and L3), one or more communication interfaces to off-chip systems (e.g., Peripheral Component Interconnect express (PCIe), gigabit ethernet (GBE)), and one or more internal communication buses (e.g., inter-integrated circuit (I2C), SMBus, PMBus, universal asynchronous receiver-transmitter (UART), or serial peripheral interface (SPI)). The power management processes disclosed herein may be applied to and/or provided on a SoC or a CPU. A computer system may include one, two, or more SoC devices (i.e., single socket or dual socket), and the SoC(s) may be connected to peripheral or external devices via a baseboard management controller (BMC). A voltage regulator (VR) for power inputs to the SoC may be a voltage regulator module (VRM) or vice versa, or the VRM may include one or more voltage regulators.

The system-on-chip described herein including a power management system responsive to data from a plurality of sensor circuits across an SoC may be provided in or integrated into any processor-based device. Examples, without limitation, include a server, a computer, a portable computer, a desktop computer, a mobile computing device, a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a wearable computing device (e.g., a smart watch, a health or fitness tracker, eyewear, etc.), a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter. P FIG. 1 illustrates a system on a chip (SoC) 100 according to an implementation and illustrates several main components of the system. In this example implementation, four processor cores are shown 101a, 101b, 101c and 101d with all four cores being a part of CPU 111. Onboard CPU 111, there may be included internal memory such as L3 cache 103. In another implementation, the CPU may have as many as 80 processor cores or more. Internal to each of the processor cores 101*a* to 101*d*, onboard memory such as L1 cache and L2 cache may be provided. The system on a chip 100 includes a power complex (PCP) domain 110 that encompasses only a portion of the system on a chip (SoC) 100. An SoC power domain 113 may encompass the remaining portions of the SoC 100. Though only one connection is shown, the CPU 111 may connect over one or more interfaces to common bus 102. The CPU 111 and the common bus 102 form the primary components in the power complex (PCP) domain 110. The common bus 102 may also connect to PCIe interfaces 112 and system management 104. The baseboard management controller (BMC) 115 may provide a connection interface to off chip peripheral devices.

The system management 104 may include a sensor monitoring processor (SMpro) 106 and a power management processor (PMpro) 108 which connect to systems present on the SoC 100. The SMpro 106 and the PMpro 108 may include I2C interfaces, utility bus connections, a PMbus, and may be coupled together. The utility buses of the PMpro 108 and the SMpro 106 may be coupled to temperature, voltage, and power sensors on processor cores 101*a*-101*d*. Likewise, the coupling between the CPU 111 and the common bus 102 may be an I2C interface or a high performance bus and the coupling between the system management 104 and the common bus 102 may be an I2C interface, a utility bus, or a high performance bus. The PMpro 108 may query various sensors and store their values in registers.

The PMpro 108 may include a processor and interfaces that provide advanced power management capabilities such as multiple power planes, clock gating, thermal protection circuits, Advanced Configuration Power Interface (ACPI) power management states, and external power throttling support. PMpro 108 and SMpro 106 may use a unified "PCP/SoC" switch fabric based on a coherent mesh interconnect to transport or transmit trace-to-memory traffic, PEM (Power Events Monitor) data, and TSM (Temperature Sensor Monitor) data as updates to PMpro 108 and/or SMpro 106. The system management 104 as well as the PMpro and SMpro processors may manage the utility bus interfaces that transport communications throughout the SoC 100.

The utility buses that may connect the system management component 104, SMpro 106, and PMpro 108 to the processor cores 101 and other CPU components (e.g., sensors, memory, controllers, etc.) tend to be slow and may not be capable of handling high bandwidths of data from large numbers of sensors. Nevertheless, the system management component 104, SMpro 106, and PMpro 108 may continue to provide higher level and slower management functions. In particular, they may report processor core conditions to an operating system (OS) or hypervisor and may receive longer-term controls such as overclocking requests, power-saving mode requests, and other management instructions. In addition, the CPU 111 may be provided directly with power estimation capabilities and direct connections to the dynamic voltage frequency scaling (DVFS) component in firmware or to the voltage regulator that sets the voltage for each processor core. The sensors and power meters may communicate with local, on-CPU power estimation components via a coherent mesh interconnect that provides high-speed communication between processor cores 101 and other CPU components. The interfaces of the PMpro 108 and the SMpro 106 may be coupled to temperature, voltage, and power sensors on processor cores 101*a*-101*d* via faster interfaces such as mesh interconnect. Likewise, the coupling between the CPU 111 and the common bus 102 may be a mesh interconnect interface and the coupling between the system management 104 and the common bus 102 may be a mech interconnect interface.

Figure 4:
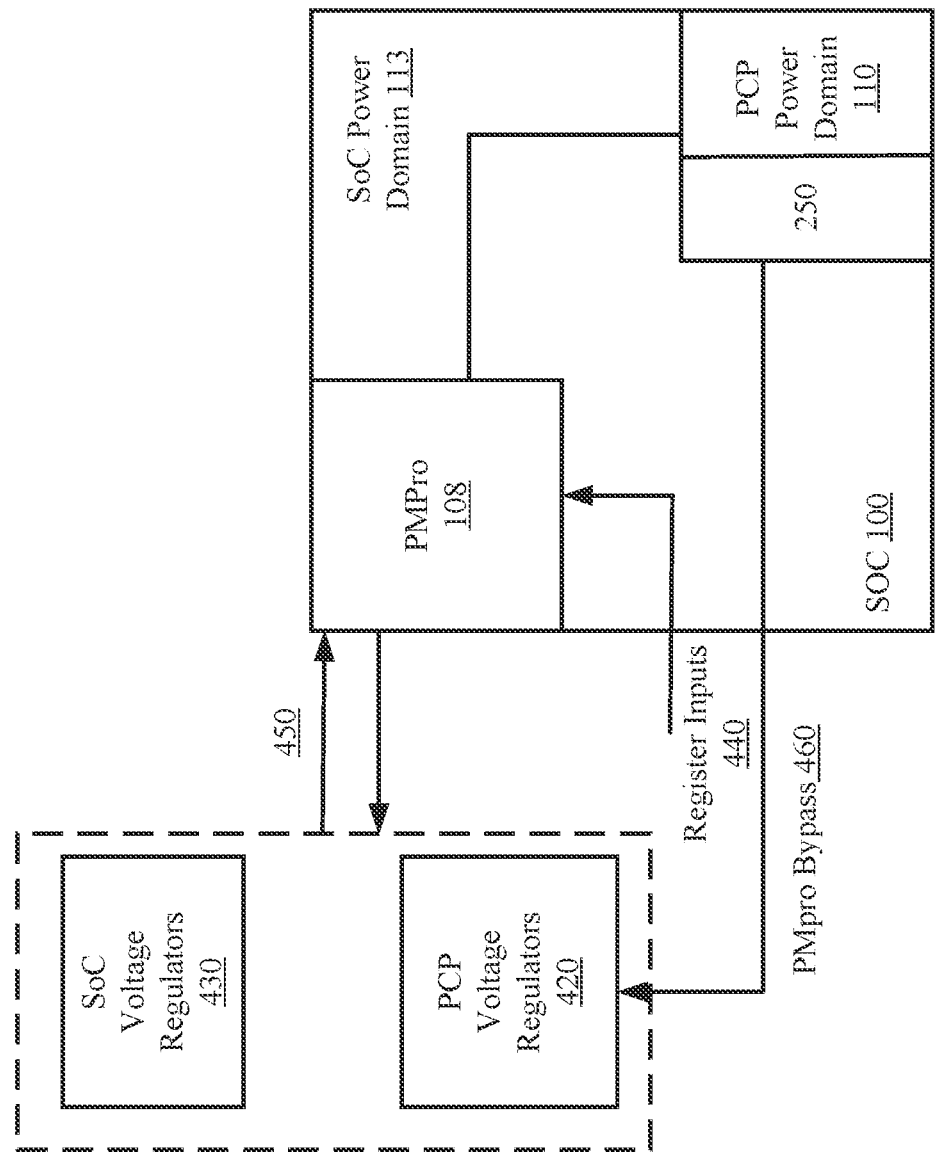
FIG. 4 is a schematic block diagram of integration between voltage regulators and the PCP power domain on a SoC according to an example implementation.

The SoC 100 includes two power domains the SoC power domain 113 and the PCP power domain 110. Each power domain has several voltage rails each of which may have different voltages. The power domains may be powered up starting with the SoC power domain and then the PCP power domain. The SoC power domain may include the on-chip memory [controllers,] controllers, generic interrupt controllers (GICs), SoC peripherals, and the SMpro 106 and PMpro 108 processors. The PCP power domain may include all the CPU cores 101*a*-101*n*, and the mesh fabric interconnect between CPU cores. The common bus 102 may be a mesh fabric interconnect framework. The SoC power domain 113 and PCP power domain 110 are independent power domains and may have distinct voltage regulators for each of their voltage rails or for each of the power domains. An example implementation of these voltage regulators and power domains are illustrated in FIG. 4.

The two power domains 110 and 113 may be controlled to remain within a power limit or to maintain efficient power balancing across the SoC 100. In addition, the two power domains 110 and 113 may be controlled based on thermal conditions or thermal power budgets. [A] The power management processor (PMpro) 108 may receive voltage readings, power readings, and/or thermal readings and may generate control signals. The voltage or power to the power domain may be controlled by voltage regulator which are signaled by a dynamic voltage frequency scaling (DVFS) component which may control a frequency or a voltage level of a voltage regulator. In particular, a particular dynamic voltage frequency scaling (DVFS) component may be only provided for the PCP power domain 110 and may be part of the PMpro 108 processor or the CPU 111.

Figure 2:
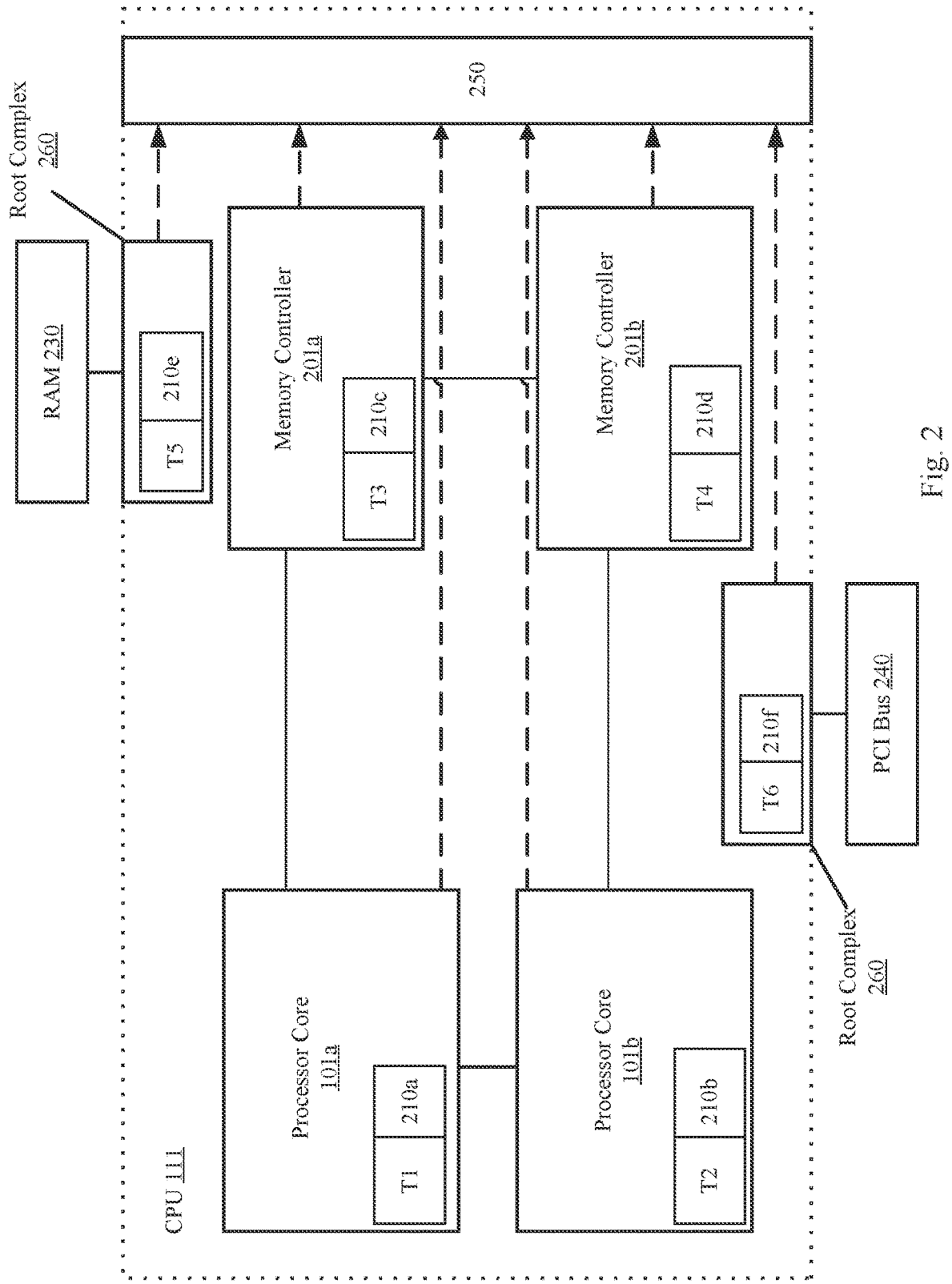
FIG. 2 is a schematic block diagram of a central processing unit (CPU) with distributed sensors according to an example implementation.

In FIG. 2, the CPU 111 is illustrated with processor cores 101*a* and 101*b*, memory controllers 201*a* and 201*b*, and a power management system 250 onboard. In addition, connections from the components of the CPU 111 to a power management system 250, external RAM 230, and a PCI bus 240 are illustrated. The memory controllers 201*a/b* and the processor cores 101*a/b* may each have temperature sensors T1-T4 and digital power meters (DPMs) 210*a-d* Furthermore, the PCI bus 240 and external RAM 230 may connect to root complexes 260 on the CPU 111 via PCI Express. These root complexes 260 may each have a temperature sensor T5-T6, and a digital power meter 210*e-f*, respectively. Additionally, the root complexes 260 may generate and/or receive messaged signal interrupts (MSIs) which may be packaged in a PCIe vector. These MSIs may be passed on to the power management system 250 to inform it when power may not be needed (e.g., port downtime).

The sensors and digital power meters on the various components of the CPU 111 may be individually connected the power management system 250 or they may each connect together as a group from each respective component, such as memory controller 201*a*. In addition or alternatively, the sensor/meter feeds (telemetry) illustrated by the dashed lines in FIG. 2 may be aggregated according to groupings (e.g., groups of processor cores and supporting infrastructure, or spatial segments of the CPU 111). Other groupings are contemplated including aggregation of sensors associated with one or more processor cores. That is, all the sensors for a processor core 101 and its memory controller 201 and memory (shared and onboard) may be grouped together. Groupings of sensors may parallel groupings for voltage control such that sensing, power estimation, and voltage/frequency control are local to one or more processor cores 101 within the mesh interconnect. The sensor/meter feeds may be provided to the power management system 250 via the mesh interconnect which may include common bus 102.

The temperature sensor T3 and the digital power meter 210c may be integrated into the circuit of the processor core 101a. The digital power meter 210c may be connected to the processor core 101a at a power input of the respective PCP power rail to measure power usage of the respective processor core 101a. Similarly, the other components 201a/b and 260 may have digital power meters 210 integrated into their circuits or may have them integrated into a power input. In particular, the memory controllers 201a/b may have one or more digital power meters 210 and one or more temperature sensors Tn. These sensors on the memory controllers 201a/b may transmit over the mesh interconnect illustrated in dashed lines to the power management system 250. The memory controllers 201a/b may control system cache (e.g., L3 cache) or memory for the coherent mesh interconnect of the CPU 111. In addition, the memory controllers 201 may be connected to the processor cores 101a and 101b for communication and temporary storage of data as illustrated.

Likewise, the processor cores 101a and 101b may be connected to each other via the mesh interconnect (non-dashed lines). The two processor cores illustrated in this implementation are exemplary and CPU 111 may include 80 processor cores or more. Likewise, the number of memory controllers 201 illustrated is exemplary and may be more or less. The memory controllers 201 may experience different loads and different peak periods than the processor cores 101. The processor cores 101 and the memory controllers 201, however, may be subject to the same PCP power budget. The PMpro 108 may manage the PCP voltage by controlling the voltage regulators or the PMpro 108 may be bypassed such that the power management system 250 transmits control messages or signals to the PCP voltage regulators. The PMpro 108 may also manage the CPU frequency at CPU level. The power information from the digital power meters 210a-f and temperature sensors T1-T6 may be computed into the power estimation via an algorithm executed on the power management system 250 to accurately estimate CPU power usage.

The root complexes 260 connects the memory subsystem (e.g., memory controllers 201) to the PCI Express switch fabric that includes one or more switch devices. These root complexes 260 are similar to a host bridge in a PCI system. The root complex 260 may generate transaction requests on behalf of the CPU 111 and may be interconnected through a common bus 102. A root complex 260 may contain more than one PCI Express port and multiple switch devices that can be connected to ports on the root complex 260. The root complex 260 may include a configuration table that defines a host memory space accessible from end point devices to facilitate communication. Similarly, end point devices or peripheral devices may include a configuration table defining local memory space for reference by the host or root complex to facilitate communication. Like the rest of the CPU 111, the root complexes 260 may be subject to a CPU power budget or a PCP power domain budget. Therefore, the power management system 250 may balance power needs and monitor power usage at each of the components of the CPU 111 (e.g., memory controllers 201, root complexes 260, and processor cores 101).

Figure 3:
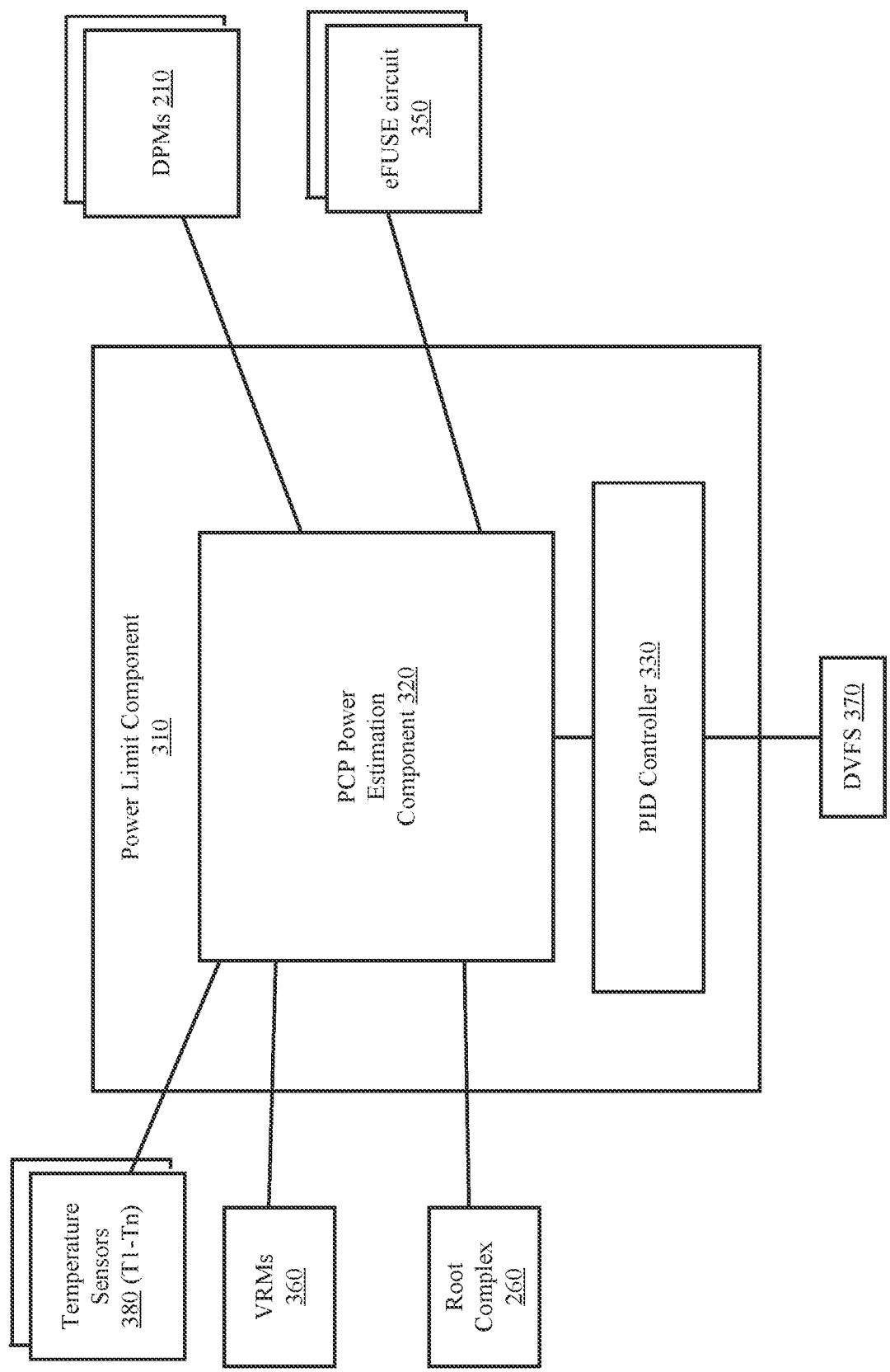
FIG. 3 is a block diagram of a power management circuit with related information sources according to an example implementation.

In FIG. 3 a power limit component 310 with feeds from various hardware components is illustrated. The power limit component 310 may be implemented as a firmware driver that processes select signals on the mesh interconnect, or as a dedicated PCP power control processor (distinct from the PMpro 108), or as a combination of hardware and software on the CPU 111. The power limit component 310 may include a PCP power estimation component 320 and a proportional-integral-derivative (PID) controller 330. The power limit component 310 may output directly to the DVFS component 370 and may bypass the PMpro 108 for more direct, fast, and efficient power control. The DVFS component 370 may control the one or more PCP voltage regulators for the one or more components associated with the respective power limit component 310. In particular, the power limit component 310 may only be provided to control the PCP power rail. The DVFS component 370 and/or power limit component 310 may be a part of or included in the power management system 250 or the PMpro 108.

The digital power meters 210 may correspond to sensors associated with or connected to one or more of the processor cores 101 or to one or more processor cores 101 in a group or subset of the processor cores 101 of the CPU 111. That is, the PCP power estimation component 320 which receives these sensor signals may be dedicated to a single processor core and its peripherals (memory, controllers, etc.) such that the control loop between sensor, processing, and applied voltage/frequency control is a relatively low-latency loop. Additionally, a PCP power estimation component 320 may connect to multiple processors and their peripherals. These multiple processors may form a control group such that a single voltage regulator controls frequency and voltage to the control group. For example, the processor cores 101a and 101b as well as the respective memory controllers 201a and 201b may form a control group and power management system 250 connected to the mesh interconnect may host the power limit component 310. A processor core 101 may be divided into one or more functional blocks (or hundreds of functional blocks) which may be individually clock gated so that an operating frequency at a block level may be controlled. The DPMs 210 may detect power usage on a functional block level. Additionally, a single PCP power estimation component 320 may be configured to process signals from all the processor cores 101 and other components on the CPU 111 to estimate power usage within a PCP power budget.

The power limit component 310 may include one or more PCP power estimation components 320 that each may be connected to or associated with one or more groups of components and their sensors. Accordingly, the PCP power estimation components 320 may be distributed throughout the mesh interconnect between processor cores 101 so as to provide local power estimation and near-real-time control information to one or more DVFS components 370. The CPU 111 may have a plurality of interconnected processor cores 101, interconnected memory controllers 201, and peripherals such as RAM 230 and the PCI Bus 240 which are connected by the coherent mesh interconnect. In one aspect, the mesh interconnect may be ARM coherent mesh interconnect distributed across the CPU architecture and connected to each component of the CPU with mesh turbo capabilities. The coherent mesh interconnect may include coherent memory controllers with shared processor memory and may integrate processor accelerators as nodes.

Each of the processor cores 101 (nodes) may be coupled to neighboring adjacent nodes by way of the mesh interconnect and the mesh interconnect may have a turbo mode that is scaled or switched ON/OFF based on control from the power limit component 310. These mesh interconnects of nodes may include a coherent memory request network, a notification network, a multiple request network, and a multiple request count network. Any type of interconnect formation may be used, such as any size array or grouping, or other forms of mesh interconnects such as a cross-bar switch, a ring interconnect, a point-to-point mesh fabric, a mesh with diagonal interconnects, etc. The mesh interconnect network may be a broadcast-based network (e.g., multicast). These interconnects may enable the local transmission and receipt of sensor data and other information that informs the PCP power estimation component 320.

The PCP power estimation component 320 may receive power information from the one or more PCIe root complexes 260, the one or more PCP voltage regulator managers (VRMs) 360, the one or more digital power meters (DPMs) 210, and the one or more eFUSE circuits 350. The voltage regulator manager 360 may provide status information of current voltage level settings for the one or more components under its control (or on its power rail). The root complexes 260 may transmit PCIe vectors with MSI signals that inform the power estimation component 320 of reduced power needs or inactive ports on the PCIe buses. This data may be aggregated, filtered, and/or calibrated at the power management system 250 which may include the power limit component 310.

The eFUSE circuits 350 may be EEPROM or similar type circuits that encode a value associated with the respective component (e.g., clock values, maximum operating parameters, etc.). The eFUSE circuits 350 may be encoded in a one-time encoding that defines a leakage value of the associated hardware component (e.g., memory controller 201, processor cores 101, or root complexes 260). The leakage value may be the static leakage portion of the power loss equation which is due primarily to gate and channel leakage in each transistor. These leakage values for each component may be taken into account and incorporated into a calculation of the estimated power usage determined by the PCP power estimation component 320 (e.g., leakage and frequency may provide function for power losses, where higher frequencies result in more losses).

The digital power meters 210 may detect power usage on a power rail to one or more components. These digital power meters 210 may detect power based on voltage and frequency or may detect power to a component based on voltage and current (i.e., P=IV) or other methods of detecting and calculating power (e.g., with a known, measured, or set resistance). The digital power meters 210 may be connected to one or more power pins or connections associated with or a part of one or more hardware components (e.g., high/low voltage pins). The digital power meter 210 may be connected to a power rail for supplying one or more components on the CPU 111 with power and measure a current, voltage, resistance, or other components of power usage. The digital power meters 210 may signal the detection by transmitting or broadcasting over the mesh interconnect the power usage or power level value. The signal may be a digital signal such as data packets containing information about the power level, the component address, time stamps, etc. The appropriate power estimation component 320 may then receive these digital signals and filter according to relevant components (e.g., group level estimation).

The digital power meter 210 may monitor and signal the power management system 250 regarding power events and provide the functions of a power event monitor (PEM). Power events may be memory events such as L1 cache hits/misses, L2 cache hits/misses, L3 misses, translation look aside buffer misses, memory bus accesses, direct memory accesses, buffer misses, and uncacheable accesses, or may be I/O interrupts and other events that affect the processor core performance. The power events may be transmitted to the power management system 250 or the power limit component 310 when they occur or stored in memory on the DPM 210 until a transmission time or period. The transmission time or period may by synched with other DPMs 210 across the mesh interconnect of the CPU 111. The DPM 210 may also include a processor to provide error checking or filtering to prevent the transmission of erroneous data and may include memory (registers) to count power events and/or store values.

The power management system 250 or power limit component 310 may analyze event data received from the DPMs 210 at a first time interval, and may analyze data received from the temperature sensors (T1-Tn) 380 at a second time interval. The first time interval and the second time interval may be the same, or may be different. For example, the first time interval may be 100 microseconds, and the second time interval may be 10 milliseconds. In the context of the present disclosure, "concurrent" need not be simultaneous or substantially simultaneous, but rather may simply indicate that the data for the particular type of sensor can be updated within the associated time interval. That is, for example, the digital power meters may communicate their data back to the power management system 250 over the common bus 102 within the first time interval of 100 microseconds. Likewise, temperature sensors 380 may communicate their sensor data back to the power management system 250 over the mesh interconnect within the second time interval of 10 milliseconds. The time intervals may be a matter of design choice and may be chosen based on the size of the SoC 100, the number of sensors, the complexity and speed of the mesh interconnect over which the sensors communicate with the power management system 250, the desired speed of response to power or temperature events in the SoC 100, and other considerations.

The data collected from one or more of the SoC sensors may be stored in memory on the power management system 250 which may evaluate the data in memory and determine a response to events and conditions in the SoC 100 based on that data. Because the data in memory was collected substantially concurrently (i.e., was updated within the associated time interval as described above) from the SoC sensors across the entire physical area of the SoC 100 (or the entire PCP power domain), the power management system 250 may be able to determine a response that is relatively quicker and more targeted than would have been possible with a more conventional design. That is, the power management system 250 may respond to changing conditions on the CPU at a rate of 200 microseconds or at least in the hundreds of microseconds and provide control power or issue voltage and frequency control messages to voltage regulators (e.g., DVFS component 370).

For example, the power management system 250 may evaluate temperature data from the temperature sensors 380 and may determine that only a particular processing core (e.g., 101*a*) is nearing a thermal limit (based on the data from the respective temperature sensor T3). Instead of lowering an operating frequency across the entire SoC 100, the power management system 250 may lower the frequency of only the particular processing core, while maintaining better performance across the rest of the SoC 100. Similarly, the power management system 250 may evaluate power data from the digital power meters (DPMs) 210 and temperature sensors Tn and may be able to determine that based on a sum of all the power data that the PCP power domain of the SoC 100 is approaching its maximum thermal design power (TDP). The power management system 250 may further determine that the second processing core 101b is the largest contributor. Based on this determination, the power management system 250 or PMpro 108 may take action to reduce the power consumption of the second processing core 101b while allowing the rest of the SoC 100 to operate normally or may reduce power for all cores. The power management system 250 or PMpro 108 may connect to one or more DVFS components 370 Further, the power management system 250 or PMpro 108 may report the data received in a time interval to an operating system or a hypervisor, which may take advantage by scheduling new processes on processing cores that are at relatively lower temperatures than other processing cores, as an example.

Once the PCP power estimation component 320 has identified an estimated power level, the power level may be output to a proportional-integral-derivative (PID) controller 330 or other feedback control loop which may moderate or reduce fluctuations in the estimation. For example, efficiency may be improved by reduced switching of the frequency. The PID controller 330 may implement a control loop mechanism employing feedback so as to provide efficient, continuously-modulated control. A PID controller 330 continuously calculates an error value as the difference between a desired setpoint (e.g., power level) and a measured process variable (e.g., estimated power level) and applies a correction based on proportional, integral, and derivative terms. This correction may then be output to the DVFS component 370. This adjustment or error correction may be integrated into the power estimation component 320 without being a separate component. The calibration mechanism for the power estimation is illustrated in more detail in FIG. 5 and FIG. 6 and described in the corresponding disclosure. The calibration features of FIG. 5 and FIG. 6 may be separate from or integrated with the PID controller 330. Indeed, the PID controller 330 may be optional and/or may be integrated with the power management system 250.

If the SoC 100 or other processor is a field or prototype test article at 604, then the JTAG disable 605 may not occur so that the platform developer may test functionality and integrity of the chip while in a test state that operates like a secure state with JTAG functionality. Then the JTAG disable 605 may be set after testing by the manufacturer or by the platform developer.

In FIG. 4 a schematic is shown of the control and feedback flow between voltage regulators 420 and 430 supplying power and the onboard power controllers, specifically the power management processor (PMpro) 108 and the PCP power management system 250. The SoC 100 includes a PCP power domain 110 as also shown in FIG. 1. The chip floorplan outside of the PCP power domain 110 may operate on the SoC power domain 113. The SoC power domain 113 may be supplied by one or more SoC voltage regulators 430. The PMpro 108 may communicate higher level commands or instructions from a hypervisor or operating system to the power management system 250 or communicate with and control power related systems on the SoC 100 which may relate to the PCP power domain 110 and/or SoC power domain 113. The PMpro 108 may also receive inputs 440 to registers on the PMpro 108 to control enabling/disabling of the isolation cells which separate the SoC power domain 113 and the PCP power domain 110 (mostly used on start-up). The PMPro 108 may control and manage the voltage outputs of the SOC voltage regulators 430 for the SoC power domain 113 and the PCP voltage regulators 420 for the PCP power domain 110. This control of the PCP voltage regulators 420 and/or the SoC voltage regulators 430 may be conducted via a common power management bus (PMbus) 450. The PMpro 108 may manage the start-up or power ramp/sequencing of the SoC and PCP power domains.

The PCP power domain 110 and/or the PCP power management system 250 is provided with a way to bypass (PMpro bypass 460) the slower utility bus connections of the PMpro 108 and directly manage the DVFS components 370 that instruct the PCP voltage regulators 420 for the PCP power domain 110. These voltage regulators 420 may still supply power through the PMpro 108 and may communicate with the PMpro 108, especially on start-up. The PCP voltage regulators 420 for the PCP power domain 110 may be directly controlled by a DVFS 370 which is informed by one or more PCP power estimation components 320 in a power limit component 310 or the power management system 250. These controls to the PCP voltage regulators 420 may operate on a per-core level or per-component level. In one aspect, the PCP voltage regulators 420 may output voltages on multiple lines to various components of the CPU 111—and the PCP power domain components in particular. In an implementation, the voltage/power outputs may each be routed through the PMpro 108 or may be routed directly to the PCP power domain components. The voltage outputs may be low voltage outputs (e.g., 0.75V, 1.8V, or the like) to keep power usage and temperatures low in the PCP power domain areas of the SoC 100. The voltage regulators 420 may also be disposed on the SoC 100 and may be disposed on the CPU 111 to increase efficiency.

Likewise, the frequency may be controlled by a DVFS component 370 which may be a part of the power management system 250. The PCP voltage regulators 420 and 430 may be disposed on the CPU 111 for more direct control and may provide operational data to the PMpro 108 in the form of telemetry feeds of operating conditions such as temperature, frequency, voltage, faults, and the like. Thus, the voltage regulators 420 for the PCP power domain 110 may be controlled independently of the PMpro 108 via PMpro bypass 460 and may use the telemetry functions of the PMpro 108 and SMpro 106 to communicate with higher level software such as an OS or hypervisor. The PMpro 108 may be controlled to operate in a bypass mode such that voltage and frequency control (or at least PCP voltage control) is not applied by the PMpro 108 and such that control may be left solely with DVFS components 370 managed by the power management system 250 and/or power limit component 310. A control of the voltage regulator control may include firmware-level DVFS control originating from the power management system 250 or the PMpro 108.

Figure 5:
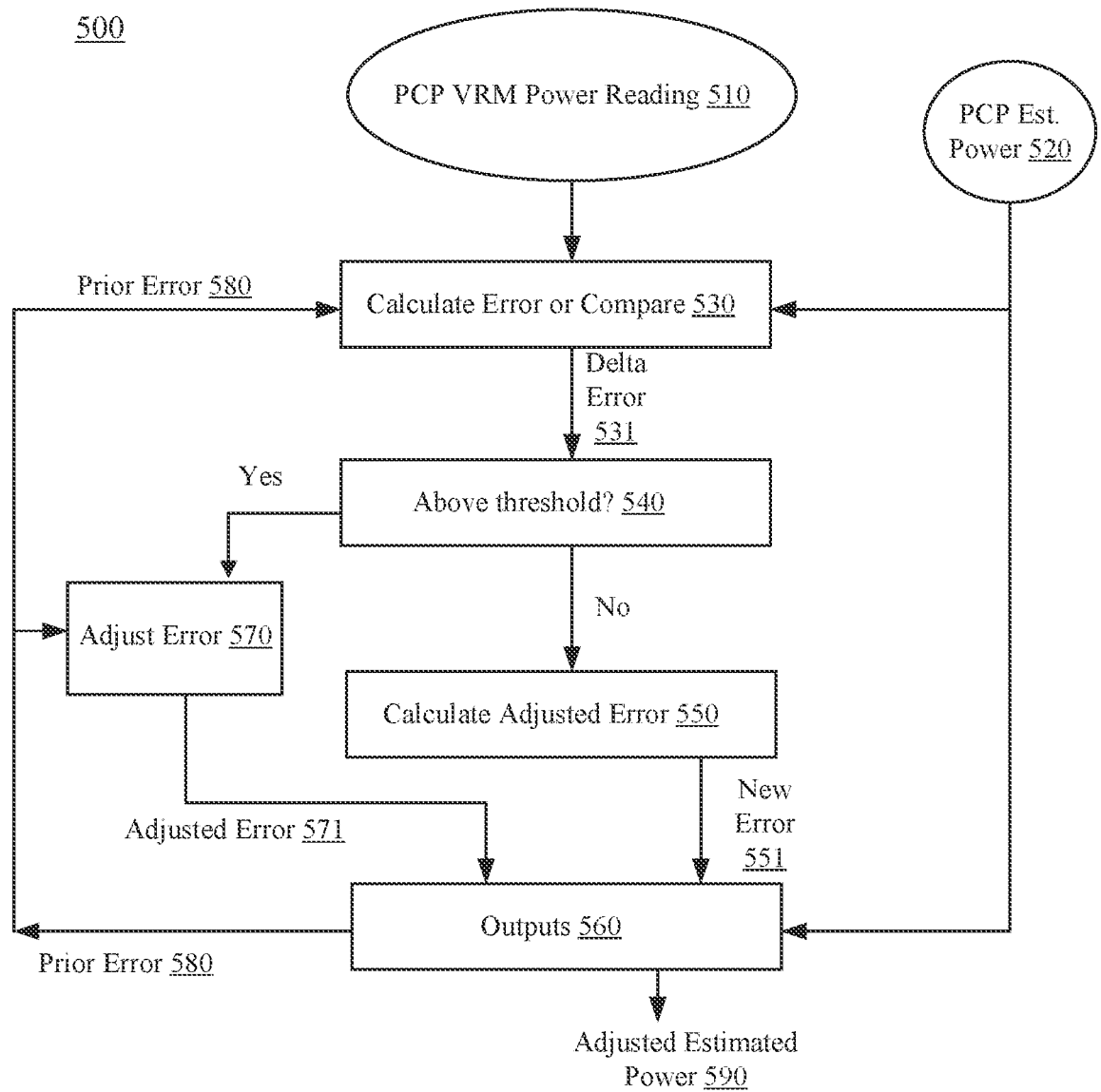
FIG. 5 is a flow diagram illustrating a calibration process for power readings according to an example implementation.

The power estimation as illustrated in FIG. 3 may require further calibration or correction to improve the accuracy of the digital power meters and other data within short time scales. That is, the PCP power estimation component 320 may aggregate data from a variety of sources within a time interval to generate a power estimate. That estimate may require correction or calibration based on the actual power and frequency settings at the time of measurement. Therefore, FIG. 5 provides a comparison and correction process to calculate an adjusted estimated power 590 for transmission to the DVFS component(s) 370 or PMpro 108. As initial inputs, the calibration process 500 may receive PCP power readings 510 from the voltage regulator module (e.g., voltage regulator 420) and a PCP estimated power 520 from the PCP power estimation component 320 or DPM 210.

At a first functional level, the calibration process 500 operates to periodically adjust power estimates from the power estimation component 320 by comparing them with the raw measurements from voltage regulator (VR) readings of power usage. If a comparison result is greater than a threshold then a prior error for the power estimation may be used as a basis for the calibration. Note that the estimate is not replaced by the VR reading upon failing a comparison, but instead a prior error is used as a replacement value and then adjusted as a part of the calibration. If the estimated power is acceptable, then this value may also be adjusted and provided to the relevant control device. Accordingly, the calibration process 500 operates to adjust estimates on a longer time period than the raw measurements from temperature sensors, voltage regulators, and the like and/or on a longer time period than power estimates from the power estimation component 320. That is, between measurements from the voltage regulator, the prior calibration may be applied to the power estimates until the calibration value or error is updated in a repeated, second iteration of the calibration process 500.

More specifically, this calibration process 500 may be integrated into the power estimation component 320 or the power limit component 310 as a subsequent process after an initial estimate based on the various measured data inputs from sensors (e.g., temperature, power, PCI vectors, power events, etc.). The inputs (e.g. PCP power reading 510 and power estimation 520) may have different calculation or transmission frequencies. For example, the power estimate from the DPMs 210 may be received every 200 microseconds and the power reading from the voltage regulator 420 may be received every 500 milliseconds. Accordingly, the calibration and correction process 500 may be periodic and may only occur every five hundred to ten thousand cycles or may only receive new correction information from the voltage regulator every five hundred to ten thousand cycles. The PCP power reading 510 and the PCP power estimation 520 are compared using a prior error 580 at block 530.

The comparison of block 530 may output a delta error 531 based on (1) the PCP power reading 510, (2) the PCP power estimate 520 (or the DPM reading), and (3) a prior error 580 stored from a prior iteration of the calibration process 500. For example, the delta error 531 may be calculated as VR reading 510 minus the sum of the DPM reading 520 and the prior error. The delta error may then be compared with a threshold (e.g., greater than 5 W) at block 540. If the delta error is greater than the threshold, the block 540 may proceed with block 570 to adjust a prior error 580, and output the adjusted error 571 rather than the new error 551. If the delta error is less than the threshold, then a new error 551 may be calculated at block 550. The adjustment of the prior error 580 at block 570 may be by a fixed amount. That is, in this case, the adjusted error 571 may be based on prior errors 580.

On the other hand, if the delta error 531 from process 530 is not above the threshold, then a new error 551 may be calculated by scaling the delta error 531 and summing the scaled delta error with the prior error 580 at block 550. Thus, at an output block 560, the inputs may be a new error 551 and the original DPM reading 520 or an adjusted error 571 and the original PCP power estimate 520. Thus, the output of block 560 may be either an adjusted error 571 based primarily on a prior error 580 (e.g., plus a correction factor) or the new error 551 inputted may be a scaled sum of the prior error 580 and the delta error 531. The output error, whether new error 551 or adjusted error 571, may then be stored as a prior error 580 in memory at the PCP power estimation component 320 or the power management system 250. In addition, an adjustment is applied to the power estimate or DPM measurement 520 based on the new error 551 or the adjusted error 571. For example, an adjusted error 571 may be added to the PCP power estimate 520 or the new error 551 may be incorporated into the PCP power estimate 520. Thus, an adjusted power estimate 590 (or calibration value of prior error 580) is also output by the output process 560. The power and current limits of the management firmware control loops may be based on the adjusted power estimate 590. This calibration process 500 may stabilize and improve the estimations and measurements produced by the PCP power estimation components 320 and DPMs 210. The adjusted power estimate 590 (or calibration value) may be applied to each power estimation until the VR power meter is read again. A calibration setting or percentage or threshold for the calibration process 500 may be set in or stored in non-volatile programmable read only memory (NVPROM).

Figure 6:
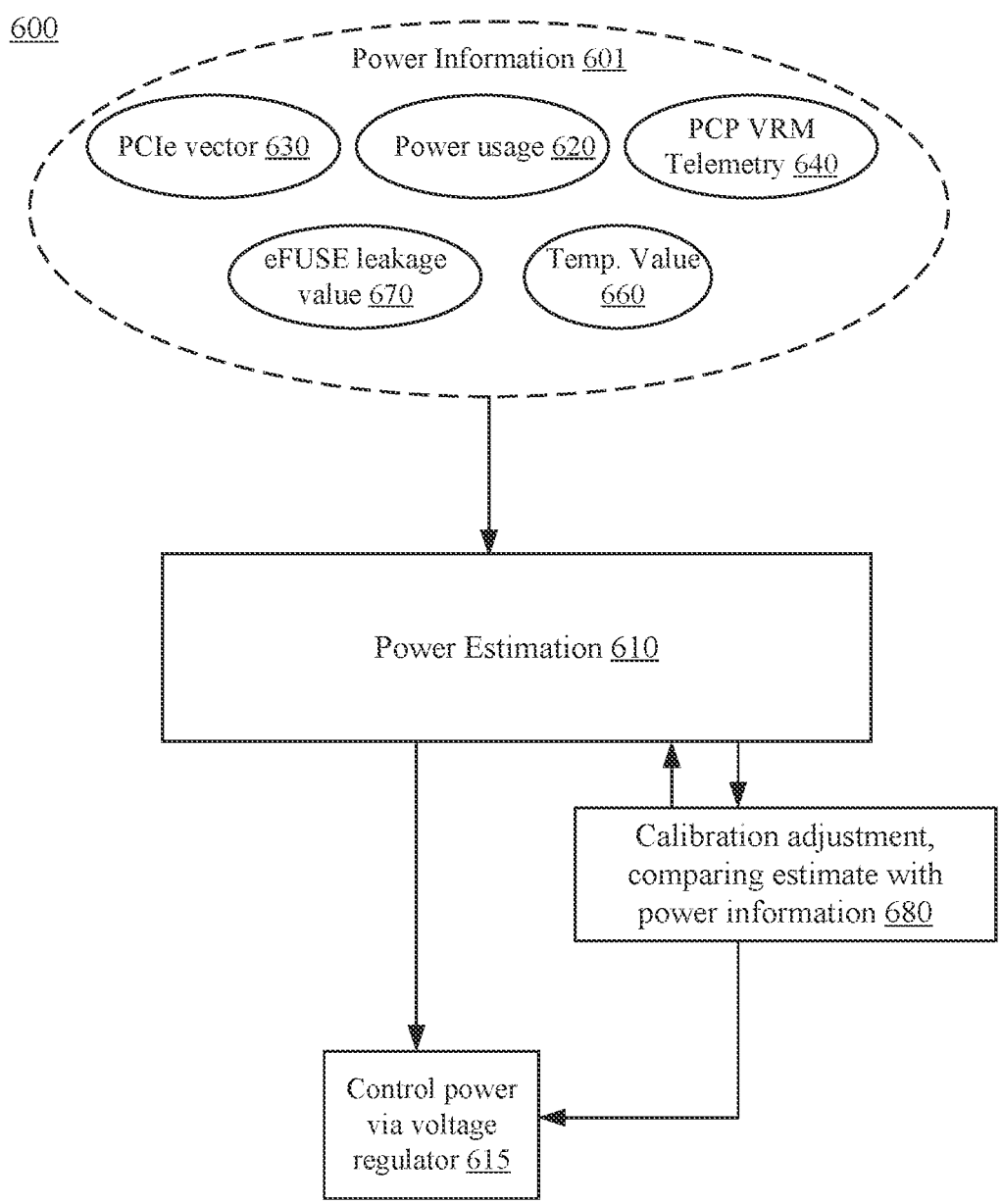
FIG. 6 is an information flow diagram for a power management system according to an example implementation.

An overview of information flows 600 is shown in FIG. 6 which mirrors the structural diagram of FIG. 3 showing the various sources of this power information. The informational inputs to the power estimation process 610 may include but are not limited to: (1) power usage 620 from one or more digital power meters 210, (2) PCIe vectors 630 from one or more root complexes 260, (3) telemetry data 640 from the voltage regulator modules (VRM) of the PCP power domain 110, (4) the temperature reading value 660 of one or more temperature sensors (e.g., T1-Tn), and (5) an eFUSE leakage value 670 assigned to a component and based on its design. The reporting or transmission periods for these various types of information may vary for each type of information source or sensor (e.g., every 200 µs, 500 µs, 1 ms, 100 ms, 500 ms, etc.) and may not be concurrent. The transmission of the power information 601 over the mesh interconnect may be asynchronous or synchronous such that sensors for one value may broadcast at a same time interval or at different assigned time intervals or such that the sensors for all values may broadcast at a same interval or at different assigned time intervals.

The PCP power estimation component 320 may store one or more of the pieces of power information 601 in between transmission intervals so that the prior received value may be used in power estimation 610 together with other variables received at shorter intervals. For example, the PCP VRM telemetry 640 may be supplied via the PMpro 108 at longer intervals than DPM readings of power usage 620. To perform the process of FIG. 5, the PCP VRM telemetry 640 with the voltage reading may be stored and compared repeatedly on shorter time scales with DPM readings. Two values which may be received on the short time scales (e.g., about 200 µs) are the temperature sensor readings 660 and the power usage 620 from the DPMs 210. These two values may be used to generate PCP power estimations at similar or the same time scales (i.e., 200 µs) so that the DVFS component 370 or VRMs may be updated or adjusted at this time scale. The DVFS set value 690 from one or more DVFS components 370 may be changed or transmitted to the voltage regulator based on the power estimation 610 or the corrected (calibrated) power estimation from calibration block 680.

The power information 601 is then transmitted from the various structural components or hardware illustrated in FIG. 3 and received as power estimation component for a power estimation. The power estimation block 610 may generate a power estimate value based on a first power information (e.g., from a DPM) and a second power information (e.g., from a voltage regulator). The calibration adjustment block 680 may generate comparison information by comparing the first power information to the second power information or comparing the power estimate value to one or more elements of power information 601. The power to the first component or the system-on-a-chip may be controlled at block 615 based on the power estimate value or the comparison information.

When the power estimate is not being calibrated in a calibration cycle (e.g., between calibration cycles), the power estimation block 610 may supply a power estimate directly to control power via a voltage regulator at block 615. The power estimation block 610 may calibrate, between calibration cycles, based on a prior calibration adjustment received as illustrated. The power estimation value may be directly calibrated via calibration adjustment block 680 and the calibrated value output to power control block 615. As noted previously, the calibration cycle may depend or occur only upon receiving readings from the VR or VRM. In any case, the calibration may be applied by determining a correction value from the comparisons noted above and applying that correction value to the first power information and/or to the power estimate value. These corrected power estimate values and/or first power information may be output to the DVFS component 370.

The entire process of FIG. 6 may occur on the CPU 111 such that the PCP voltage regulators 420 are disposed (integrated) in CPU space along with the power estimation components 310 and the power management system 250 for the PCP power domain 110. In addition, the transmission of the power information 610 may be entirely by coherent mesh interconnect or at least partially coherent mesh interconnect within the CPU 111. Thus, power estimation 610 is not dependent on receiving power information over a utility bus interface or similar serial interface and may operate at a much higher frequency as a result. Similarly, the entire process of FIG. 6 may occur on the CPU 111 such that DVFS components 370 are provided in firmware of the CPU 111 and are controlled to manage the voltage regulators 420.

Figure 7:
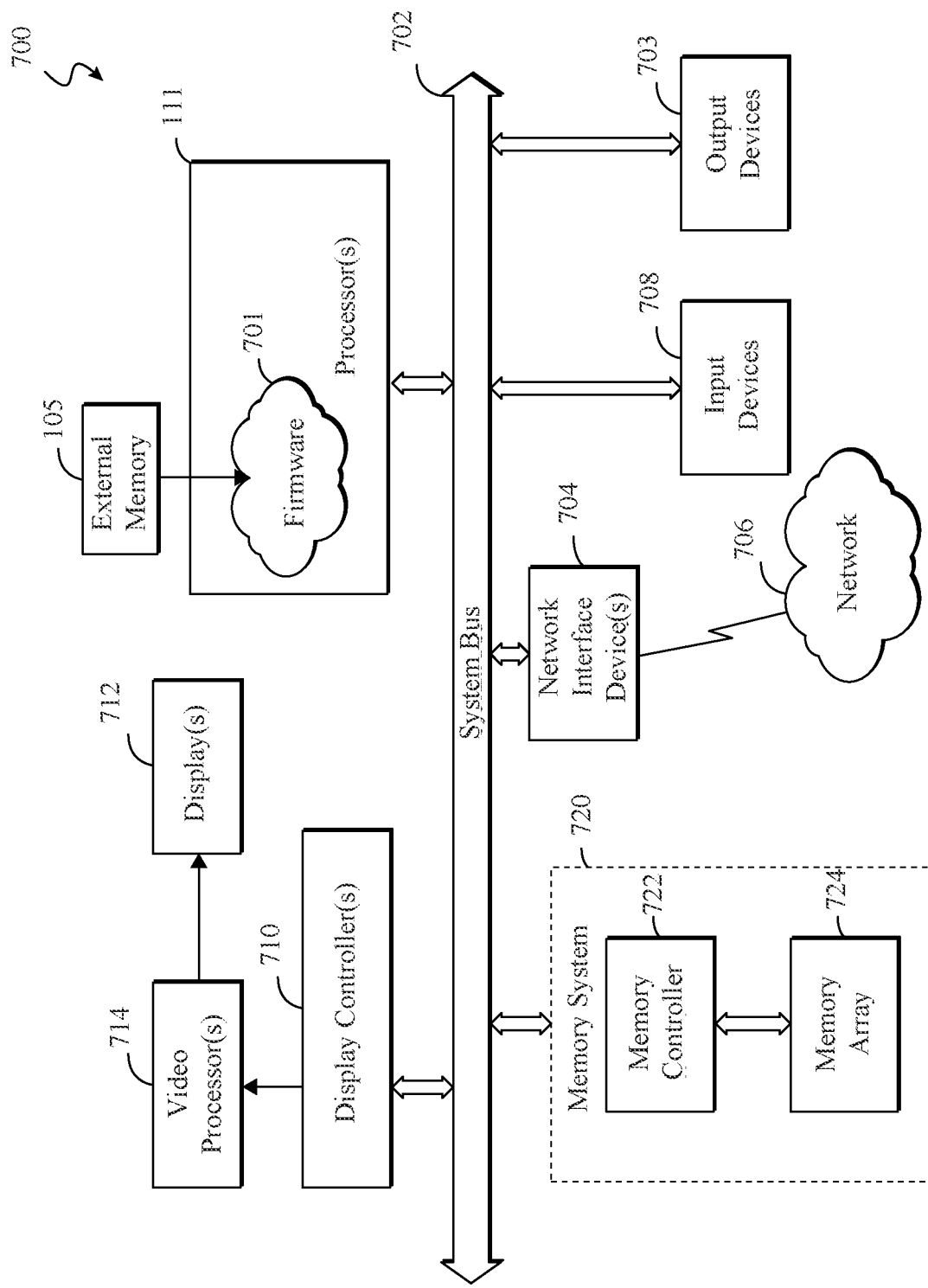
FIG. 7 is a system diagram of an example computer system which may contain a SoC according to an example implementation.

In this regard, FIG. 7 illustrates an example of a processor-based system 700 that can collect and manage data from a plurality of sensors across an SoC 100 as illustrated in FIG. 2 and described with respect to FIG. 3 and FIG. 6. In this example, the processor-based system 700 includes a processor SoC 100 (which may have one or more central processing units (CPUs), each including one or more processor cores) and as such may include the power management system 250 (which may be executed on a CPU 111 of the processor-based system 700), which may be configured to collect and manage data from a plurality of sensors across an SoC as illustrated and described with respect to FIG. 3 and FIG. 6. The power management system 250 may be encoded in firmware 701 and connected to various sensors within the CPU 111 via a coherent mesh interconnect.

The SoC 100 containing CPU 111 may be a master device and may be coupled to a system bus 702 that can intercouple master and slave devices included in the processor-based system 700. The SoC 100 and CPU 111 may communicate with these other devices by exchanging address, control, and data information over the system bus 702. For example, the SoC 100 and CPU 111 may communicate bus transaction requests to a memory controller 722 as an example of a slave device. Although not illustrated in FIG. 7, multiple system buses 702 could be provided, wherein each system bus 720 constitutes a different fabric. The system bus 702 may be an internal common bus of the CPU 111. The system bus 702 may be a bus such as those based on the I2C protocol, SPI protocol, or the PCIe protocol.

Other master and slave devices can be connected to the system bus 702. As illustrated in FIG. 7, these devices can include a memory system 720, one or more input devices 708, one or more output devices 703, one or more network interface devices 704, and one or more display controllers 710, as examples. The input device(s) 708 can include any type of input device, including, but not limited to, input keys, switches, voice processors, etc. The output device(s) 703 can include any type of output device, including, but not limited to, audio, video, other visual indicators, etc. The network interface device(s) 704 can be any devices configured to allow exchange of data to and from a network 706. The network 706 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 704 can be configured to support any type of communications protocol desired. The memory system 720 can include the memory controller 702 coupled to one or more memory array 724.

The SoC with CPU 111 may also be configured to access the display controller(s) 710 over the system bus 702 to control information sent to one or more displays 712. The display controller(s) 710 sends information to the display(s) 712 to be displayed via one or more video processors 714, which process the information to be displayed into a format suitable for the display(s) 712. The display(s) 712 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

The invention claimed is:

1. A method for processor power management, comprising:
receiving first power information from a digital power meter (DPM) associated with a first component of a system-on-a-chip;
receiving second power information from a voltage regulator (VR) associated with the first component of the system-on-a-chip;
generating a power estimate value based on the first power information and the second power information; and
generating comparison information based on the first power information, the second power information, and a prior error representing a difference between a read power usage and an estimated power usage of the first component during a prior iteration of a calibration process, the first power information, the second power information, and the prior error all being direct inputs in generating the comparison information,
wherein a power to the first component or the system-on-a-chip is controlled based on the power estimate value and the comparison information.

2. The method of claim 1, further comprising:
determining a correction value based on the comparison information;
generating a corrected first power information by applying the correction value to the first power information;
generating a corrected power estimate value based on the corrected first power information and the second power information; and
outputting the corrected power estimate value to a dynamic voltage and frequency scaling (DVFS) component to manage the power to the first component and/or a system power to the system-on-a-chip.

3. The method of claim 1,
wherein the DPM measures a first power usage of the first component, the first power information including the first power usage,
wherein the first component is a memory controller, a peripheral component interconnect express (PCIe) root complex, a processor core, a system management controller, or a common interface management controller.

4. The method of claim 1, further comprising:
measuring, via the DPM, a first power usage from the first component, the first power information including the first power usage; and
scaling the first power usage based on at least one parameter of the component,
wherein the first component is a PCIe root complex and the at least one parameter is a PCIe vector, or
wherein the first component is a processor core and the at least one parameter is a voltage or a temperature of the processor core.

5. The method of claim 4,
wherein the first component is the PCIe root complex and the at least one parameter is the PCIe vector, and
wherein the PCIe vector includes a message signaled interrupt from a bus interface.

6. The method of claim 1, further comprising:
estimating a power leakage of the first component;
scaling the power leakage based on a voltage or a temperature of the first component.

7. The method of claim 1, further comprising:
measuring, via a DPM, a first power usage from the first component, the first power information including the first power usage; and
scaling the first power usage based on at least one parameter of the component,
wherein the first component is a PCIe root complex and the at least one parameter is a PCIe vector,
wherein the PCIe root complex is connected to the at least one processor core via a bus interface.

8. An apparatus comprising means for:
receiving first power information from a digital power meter (DPM) associated with a first component of a system-on-a-chip;
receiving second power information from a voltage regulator (VR) associated with the first component of the system-on-a-chip;
generating a power estimate value based on the first power information and the second power information; and
generating comparison information based on the first power information, the second power information, and a prior error representing a difference between a read power usage and an estimated power usage of the first component during a prior iteration of a calibration process, the first power information, the second power information, and the prior error all being direct inputs in generating the comparison information, wherein a power to the first component or the system-on-a-chip is controlled based on the power estimate value and the comparison information.

9. The method of claim 2, further comprising:
receiving at a proportional-integral-derivative (PID) controller the corrected power estimate; and
generating a control value at the PID controller;
calibrate a processor complex (PCP) power via the DVFS component based on the control value and/or the corrected power estimate.

10. The method of claim 1, further comprising:
receiving third power information from another digital power meter (DPM) associated with a second component of the system-on-a-chip;
receiving fourth power information from another voltage regulator (VR) associated with the second component of the system-on-a-chip;
generating the power estimate value based on the first power information, the second power information, the third power information, and the fourth power information,
wherein at least one DPM is connected to each processor core of at least four processor cores of the system-on-a-chip.

11. A non-transitory computer readable medium storing one or more computer executable instructions that when executed on one or more processors causes the one or more processors to perform the method of:
receiving first power information from a digital power meter (DPM) associated with a first component of a system-on-a-chip;
receiving second power information from a voltage regulator (VR) associated with the first component of the system-on-a-chip;
generating a power estimate value based on the first power information and the second power information; and
generating comparison information based on the first power information, the second power information, and a prior error representing a difference between a read power usage and an estimated power usage of the first component during a prior iteration of a calibration process, the first power information, the second power information, and the prior error all being direct inputs in generating the comparison information,
wherein a power to the first component or the system-on-a-chip is controlled based on the power estimate value and the comparison information.

12. The method of claim 1,
wherein the system-on-a-chip further includes at least four processor cores and at least one memory controller,
wherein each processor core of the at least four processor cores and each of the at least one memory controller is connected to at least one corresponding, different DPM,
wherein separate power information from each corresponding, different DPM is combined together with the first power information and the second power information to calculate the power estimate value,
wherein a PCP power to at least one of the at least four processor cores or to the at least one memory controller is controlled by a dynamic voltage and frequency scaling (DVFS) component based on the power estimate value.

13. A power management circuit, comprising:
a first input receiving first power information from a digital power meter (DPM) connected to a first component of a system-on-a-chip;
a second input receiving second power information from a voltage regulator (VR) connected to the first component of the system-on-a-chip;
a power estimation component determining a power estimate value based on the first power information and the second power information and generating comparison information based on the first power information, the second power information, and a prior error representing a difference between a read power usage and an estimated power usage of the first component during a prior iteration of a calibration process, the first power information, the second power information, and the prior error all being direct inputs in generating the comparison information,
wherein a power of the first component or the system-on-a-chip is controlled based on the power estimate value and the comparison information.

14. The power management circuit of claim 13,
wherein the power estimation component further determines a correction value based on the comparison information, generates a corrected first power information by applying the correction value to the first power information, and generates a corrected power estimate value based on the corrected first power information and the second power information,
wherein the power estimation transmits the corrected power estimate value to a dynamic voltage and frequency scaling (DVFS) component that manages the power to the first component or the system-on-a-chip.

15. The power management circuit of claim 13,
wherein the DPM measures a first power usage of the first component, the first power information including the first power usage,
wherein the first component is a memory controller, a peripheral component interconnect express (PCIe) root complex, a processor core, a system management controller, or a common interface management controller.

16. The power management circuit of claim 13,
wherein the DPM measures a first power usage from the first component as the first power information and scales the first power usage based on at least one parameter of the component,
wherein the first component is a PCIe root complex and the at least one parameter is a PCIe vector, or
wherein the first component is a processor core and the at least one parameter is a voltage or a temperature of the processor core.

17. The power management circuit of claim 13, wherein the PCIe vector includes a message signaled interrupt from a bus interface of the at least one processor core.

18. The power management circuit of claim 13,
wherein the power estimation component determines a power leakage of the first component and scales the power leakage based on a voltage or a temperature of the first component, and
wherein the power leakage is a static power leakage or a dynamic power leakage.

19. The power management circuit of claim 18, wherein the power leakage of the first component is based on a power leakage value read from a programmable fuse of the first component.

20. The power management circuit of claim 14, further comprising;
- a proportional-integral-derivative (PID) controller that receives the corrected power estimate and generates a control value at the PID controller;
- wherein the DVFS component calibrates a processor complex (PCP) power based on the control value and/or the corrected power estimate.

21. The method of claim 1,
- wherein the first power information is repeatedly received with a first duration between receipts of two consecutive first power information,
- wherein the second power information is repeatedly received with a second duration between receipts of two consecutive second power information,
- wherein within a current time interval, if the first power information is received and the second power information is not received, generating the power estimate value based on the first power information received in the current time interval and the second power information received in a previous time interval, and
- wherein within the current time interval, if the first power information is not received and the second power information is received, generating the power estimate value based on the first power information received in the previous time interval and the second power information received in the current time interval.

22. The apparatus of claim 8,
- wherein the first power information is repeatedly received with a first duration between receipts of two consecutive first power information,
- wherein the second power information is repeatedly received with a second duration between receipts of two consecutive second power information,
- wherein within a current time interval, if the first power information is received and the second power information is not received, the apparatus further comprises means for generating the power estimate value based on the first power information received in the current time interval and the second power information received in a previous time interval, and
- wherein within the current time interval, if the first power information is not received and the second power information is received, the apparatus further comprises means for generating the power estimate value based on the first power information received in the previous time interval and the second power information received in the current time interval.

23. The non-transitory computer readable medium of claim 11,
- wherein the first power information is repeatedly received with a first duration between receipts of two consecutive first power information,
- wherein the second power information is repeatedly received with a second duration between receipts of two consecutive second power information,
- wherein within a current time interval, if the first power information is received and the second power information is not received, the executable instructions cause the one or more processors to perform generating the power estimate value based on the first power information received in the current time interval and the second power information received in a previous time interval, and
- wherein within the current time interval, if the first power information is not received and the second power information is received, the executable instructions cause the one or more processors to perform generating the power estimate value based on the first power information received in the previous time interval and the second power information received in the current time interval.

24. The power management circuit of claim 13,
- wherein the first power information is repeatedly received with a first duration between receipts of two consecutive first power information,
- wherein the second power information is repeatedly received with a second duration between receipts of two consecutive second power information,
- wherein within a current time interval, if the first power information is received and the second power information is not received, the power estimation component generates the power estimate value based on the first power information received in the current time interval and the second power information received in a previous time interval, and
- wherein within the current time interval, if the first power information is not received and the second power information is received, the power estimation component generates the power estimate value based on the first power information received in the previous time interval and the second power information received in the current time interval.

\* \* \* \* \*